United States Patent
Martin-Cocher et al.

(10) Patent No.: US 8,761,240 B2
(45) Date of Patent: Jun. 24, 2014

(54) METHODS AND DEVICES FOR DATA COMPRESSION USING CONTEXT-BASED CODING ORDER

(75) Inventors: Gaelle Christine Martin-Cocher, Toronto (CA); Dake He, Waterloo (CA); Gergely Ferenc Korodi, Waterloo (CA)

(73) Assignee: Blackberry Limited, Waterloo, Ontario (CA)

( * ) Notice: Subject to any disclaimer, the term of this patent is extended or adjusted under 35 U.S.C. 154(b) by 298 days.

(21) Appl. No.: 13/181,576

(22) Filed: Jul. 13, 2011

(65) Prior Publication Data

US 2012/0014457 A1 Jan. 19, 2012

Related U.S. Application Data

(60) Provisional application No. 61/363,717, filed on Jul. 13, 2010.

(51) Int. Cl.
*H04N 7/12* (2006.01)
*H04N 11/02* (2006.01)
*H04N 11/04* (2006.01)

(52) U.S. Cl.
USPC .......................................................... 375/240

(58) Field of Classification Search
None
See application file for complete search history.

(56) References Cited

U.S. PATENT DOCUMENTS

| | | | |
|---|---|---|---|
| 5,148,272 A | 9/1992 | Acampora | |
| 5,381,145 A | 1/1995 | Allen | |
| 5,471,207 A * | 11/1995 | Zandi et al. ................... | 341/107 |
| 5,717,394 A | 2/1998 | Schwartz | |
| 6,661,839 B1 | 12/2003 | Ishida | |
| 7,545,293 B2 | 6/2009 | Reznik | |
| 7,573,407 B2 | 8/2009 | Reznik | |
| 2003/0225997 A1 | 12/2003 | Kirovski et al. | |
| 2006/0158355 A1 | 7/2006 | Jeon | |
| 2007/0150497 A1 | 6/2007 | De La Cruz | |
| 2008/0243205 A1 | 10/2008 | Corndorf | |
| 2009/0112897 A1 | 4/2009 | Ordentlich et al. | |
| 2009/0279613 A1 | 11/2009 | Suzumura | |

FOREIGN PATENT DOCUMENTS

| | | |
|---|---|---|
| CA | 2676099 | 8/2002 |
| GB | 2285374 | 7/1995 |
| GB | 2319689 | 5/1998 |
| JP | 8065171 | 3/1996 |
| WO | 2007066121 | 6/2007 |
| WO | 2008053755 | 5/2008 |
| WO | 2009005758 | 1/2009 |
| WO | 2009157043 | 12/2009 |
| WO | 2010091505 | 8/2010 |

OTHER PUBLICATIONS

International Search Report dated Oct. 4, 2011, PCT/CA2011/050429.

(Continued)

*Primary Examiner* — Dave Czekaj
*Assistant Examiner* — Mohammad J Rahman
(74) *Attorney, Agent, or Firm* — Rowand LLP

(57) ABSTRACT

A method is presented for entropy coding data using an entropy coder to encode an input sequence. A context model is used to determine the context of each symbol and a probability estimation is made for each symbol. A method is presented for revising the coding order to be context-based, grouping symbols consecutively on the basis that they have a common context. A method is presented for entropy decoding a bitstream of encoded data encoded using a context-based coding order.

16 Claims, 9 Drawing Sheets

(56) References Cited

OTHER PUBLICATIONS

International Search Report dated Apr. 19, 2011, Application No. PCT/CA2011/050034.
Boliek M et al: "Very high speed entropy coding" Proceedings of The International Conference on Image Processing (ICIP) Austin, Nov. 13-16, 1994: [Proceedings of The International Conference on Image Processing (ICIP)] Los Alamitos, IEEE Comp. Soc. Press, US LNKD DOI:10.1109/ICIP.1194.413814, vol. 3, Nov. 13, 1994, pp. 625-629, XP010146390.
Mastronarde N H et al: "A Bargaining Theoretic Approach to Quality-Fair System Resource Allocation for Multiple Decoding Tasks" IEEE Transactions on Circuits and Systems for Video Technology, IEEE Service Center, Piscataway, NJ, US, vol. 18, No. 4, Apr. 1, 2008, pp. 453-466, XP011204010.
European Search Report dated Aug. 12, 2010.
Extended European Search Report dated Jul. 2, 2010.
Vivienne SZE, Anantha P. Chandrakasan, Madhukar Budagavi, Minhua Zhou: Parallel CABAC for low power video coding. ICIP 2008: 2096-2099. Available under http://www-video.eecs.berkeley.edu/Proceedings/ICIP2008/pdfs/0002096.pdf.
Chung-Hyo Kim and In-Cheol Park, "Parallel Decoding of Context-based Adaptive Binary Arithmetic Codes Based on Most Probable Symbol Prediction", IEICE Trans. Inf. & Syst., vol. E90?D, No. 2 Feb. 2007. p. 609. Available under http://ics.kaist.ac.kr/ver3.0/intjpapers/Paraller%20Decoding%20of%20Context-based%Adaptive%20Binary%20Arithmetic%20Codes%20Based%Based%20on%0Most%Probable%20Symbol%20Prediction.pdf.
ITU-T Recommendation H.264/IS0/IEC 14496-10 AVC, Advanced video coding for general audiovisual services, Nov. 2007.
H.264/AVC reference software, available online http://iphome.hhi.de/surhring/tml/.
International Search Report and Written Opinion, dated Apr. 19, 2011, PCT/CA2011/050034.
G.H. Freeman, "Divergence and the construction of variable-to-variable length lossless codes by source word extensions," Proc. Data Compression Conference, IEEE Computer Society Press, 1993, pp. 79-88.
W.B. Pennebaker, J.L. Mitchell, G.G. Langdon, Jr., R.B. Arps, "An overview of the basic principles of the Q-Coder adaptive binary arithmetic coder," IBM Journal of Research and Development, v.32 n. 6, p. 717-726, Nov. 1998.
Joshua Senecal, Mark Duchaineau and Kenneth I. Joy, "Length-Limited Variable-to-Variable Length Codes for High-Performance Entropy Coding," Proc. Data Compression Conference 2004, p. 389.
P.R. Stubley, "Adaptive variable-to-variable length codes," in Proc. Data Compression Conference 1994, pp. 98-105.
Freking R A et al: An unrestrictedly parallel scheme for ultra-high-rate reprogrammable Huffman coding ICASSP-,IEEE International Conference on Acoustics, Speech and Signal Processing—Proceedings 1999 IEEE, vol. 4, Mar. 15, 1999, pp. 1937-1940, XP010327787.
European Search Report dated Jul. 21, 2010.
Shay-Beren et al: "Class-based decompressor design for compressed instruction memory in embedded processors" IEEE Transactions on Computers, IEEE Service Center, Los Alamitos, CA, US LNKD D01:10.1109/TC.2003.1244947, vol. 52, No. 11, Nov. 1, 2003, pp. 1495-1500, XP011103299.
Marpe D et al: "Context-based adaptive binary arithmetic coding in the H.264/AVC video compression standard"IEEE Transactions on Circuits and Systems for Video Technology, IEEE Service Center, Piscataway, NJ, US LNKD DOI:101109/TCSVT.2003.815173, vol. 13, No. 7, Jul. 1, 2003, pp. 620-636, XP011099255.
European Search Report dated Aug. 3, 2010.
Franaszek P et al: "Parallel compression with cooperative dictionary construction" Data Compression Conference, 1996 DCC '96 Proceedings Snowbird; UT USA Mar. 31-Apr. 3, 1996, Los Alamitos CA, USA, IEEE Comput. Soc, US LNKD-D01:10.1109/DCC.1996.488325, Mar. 31, 1996, pp. 200-209, XP010156561.
Marpe D et al: "Context-based adaptive binary arithmetic coding in the H.264/AVC video compression standard"IEEE Transactions on Circuits and Systems for Video Technology, IEEE Service Center, Piscataway, NJ, US LNKD DOI:101109/TCSVT.2003.815173, vol. 13, No. 7, Jul. 1, 2003, pp. 620-636, XP011099255 ISSN: 1051-8215.
Dake et al., Improving throughput for V2V coding in HEVC, Input Document by Research in Motion Ltd. to joint Collaborative Team on Video Coding (JCT-VC), Geneva, Jul. 21-28, 2010.
Budagavi et al., Parallel Context Processing techniques for high coding efficiency entropy coding in HEVC, Input Document by Texas Instruments Inc. to Joint Collaborative Team on Video Coding (JCT-VC), Geneva, Jul. 21-28, 2010.
International Search Report dated Jul. 8, 2011, PCT/CA2011/050208.
Extended European Search Report dated Aug. 23, 2010.

* cited by examiner

METHODS AND DEVICES FOR DATA COMPRESSION USING CONTEXT-BASED CODING ORDER

CROSS-REFERENCE TO RELATED APPLICATIONS

The present application claims priority to U.S. provisional patent application Ser. No. 61/363,717, owned in common herewith and the contents of which are hereby incorporated by reference.

FIELD

The present application generally relates to data compression and, in particular, to an encoder, a decoder and methods of coding and decoding using a context-based coding order.

BACKGROUND

Data compression, whether lossy or lossless, often uses entropy coding to encode a decorrelated signal as a sequence of bits, i.e. a bitstream. Efficient data compression has a wide range of applications, such as image, audio, and video encoding. The current state-of-the-art for video encoding is the ITU-T H.264/MPEG AVC video coding standard. It defines a number of different profiles for different applications, including the Main profile, Baseline profile and others. A next-generation video encoding standard is currently under development through a joint initiative of MPEG-ITU: High Efficiency Video Coding (HEVC).

There are a number of standards for encoding/decoding images and videos, including H.264, that employ lossy compression processes to produce binary data. For example, H.264 includes a prediction operation to obtain residual data, followed by a DCT transform and quantization of the DCT coefficients. The resulting data, including quantized coefficients, motion vectors, coding mode, and other related data, is then entropy coded to generate a bitstream of data for transmission or storage on a computer-readable medium. It is expected that HEVC will also have these features.

A number of coding schemes have been developed to encode binary data. For example, JPEG images may be encoded using Huffman codes. The H.264 standard allows for two possible entropy coding processes: Context Adaptive Variable Length Coding (CAVLC) or Context Adaptive Binary Arithmetic Coding (CABAC). CABAC results in greater compression than CAVLC, but CABAC is more computationally demanding. In any of these cases, the coding scheme operates upon the binary data to produce a serial bitstream of encoded data. At the decoder, the decoding scheme receives the bitstream and entropy decodes the serial bitstream to reconstruct the binary data.

It would be advantageous to provide for an improved encoder, decoder and method of entropy coding and decoding.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
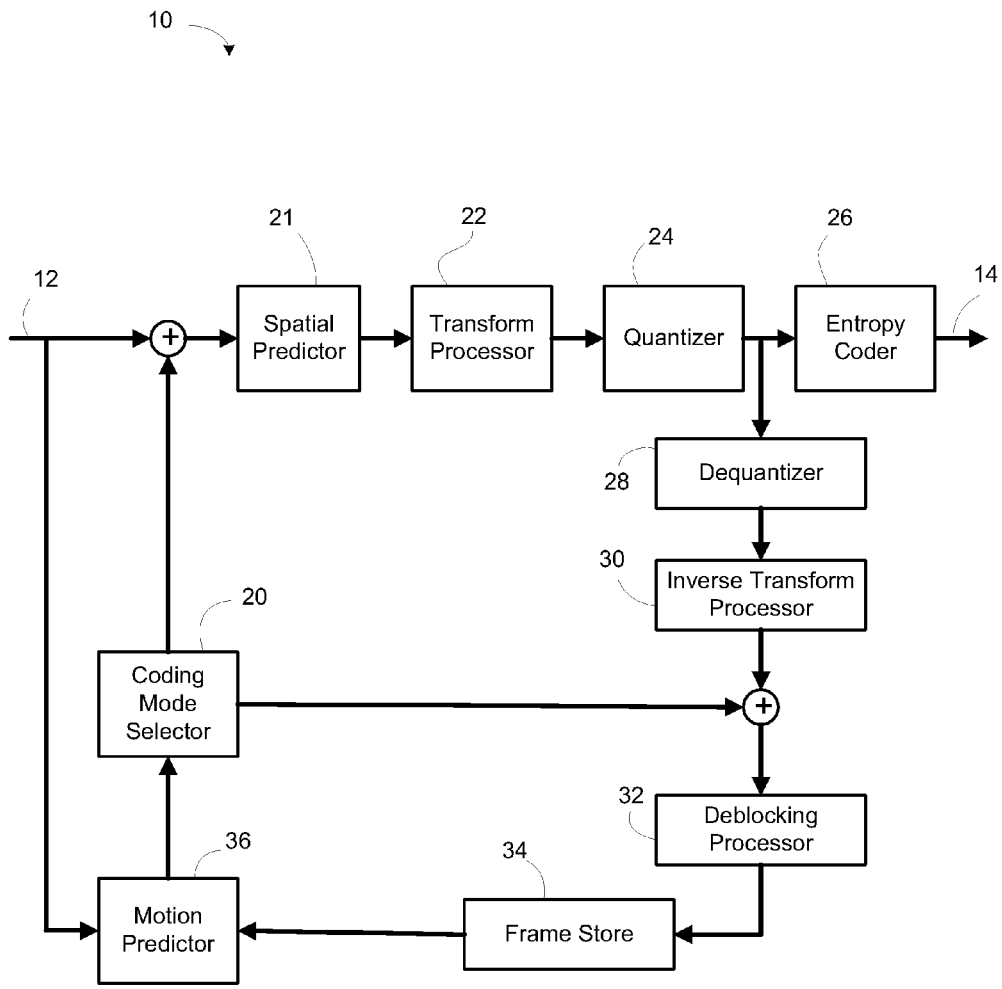
FIG. 1 shows, in block diagram form, an encoder for encoding video.

The present application describes devices, methods and processes for encoding and decoding binary data.

In one aspect, the present application describes methods of encoding an input sequence of symbols using a context-based coding order.

In a further aspect, the present application describes a method for encoding an input sequence of symbols from a finite alphabet using a context model. The method includes determining a context for each symbol of the input sequence as specified by the context model, wherein the context model specifies the context based upon information other than other symbols in the input sequence; and for each context, encoding consecutively those symbols of the input sequence having that context, to produce encoded data, wherein, for each symbol, encoding includes determining the probability of that symbol and encoding that symbol based on its determined probability, and wherein at least some of the symbols from the input sequence have a same context.

In yet another aspect, the present application describes a method of entropy encoding an input sequence of symbols using a context model, wherein the context model specifies a context for each symbol. The method includes reordering the input sequence to group the symbols on the basis of context to form groups of symbols, each group being associated with a respective one of the contexts; for each of the groups of symbols, determining a probability associated with each symbol in the group of symbols; and, for each of the groups of symbols, encoding consecutively the symbols in that group based upon their determined probabilities, to produce encoded data.

In another aspect, the present application describes an encoder for encoding an input sequence of symbols. The encoder includes a processor; memory; and an encoding application stored in memory and containing instructions for configuring the processor to encode the input sequence in accordance with one of the methods described herein.

In yet another aspect, the present application describes methods of decoding a bitstream of encoded data generated using a context-based coding order.

In one aspect, the present application describes a method for decoding encoded data to reconstruct a sequence of symbols, wherein the encoded data has been encoded in accordance with a context model, wherein the context model specifies the context for each symbol. The method includes, for each of two or more of the contexts defined in the context model, decoding a portion of the encoded data to obtain a group of consecutive symbols having that context, wherein, for each of the consecutive symbols, decoding includes determining a probability associated with that symbol and decoding that symbol from the encoded data based on that determined probability; and reconstructing the sequence of symbols by reordering the symbols of the groups of consecutive symbols.

In another aspect, the present application discloses a method for method for decoding a bitstream of encoded data to reconstruct a sequence of bits, wherein the encoded data has been encoded in accordance with a context model and a coding order. The method includes decoding the encoded data to obtain subsequences of decoded bits, wherein each subsequence of decoded bits is associated with a probability; reconstructing a group of consecutively encoded bits from the subsequences of decoded bits based upon the group of consecutively encoded bits having a same context and by determining a probability for each bit in the group; and rearranging bits of the reconstructed group on the basis of the coding order to produce a decoded bitstream.

In a further aspect, the present application describes a method for decoding a bitstream of encoded data to reconstruct a sequence of symbols, wherein the encoded data has been encoded in accordance with a context model. The method includes determining a context for each symbol to be reconstructed as specified by the context model, wherein the context model specifies the context for each symbol; for each determined context, determining the respective estimated probability of two or more symbols having that context, and obtaining each of the two or more symbols by decoding the encoded data in accordance with the estimated probability of that symbol; and reconstructing a sequence of decoded symbols from the symbols obtained.

In yet another aspect, the present application describes a method for entropy decoding a bitstream of encoded video data to reconstruct a bit sequence of video data, wherein the encoding is based on a context model, wherein the encoded video data comprises codewords, wherein the bitstream of video data includes significance maps for a group of coefficient blocks, and wherein each significance map includes a sig vector and a last vector. The method includes decoding the codewords to obtain subsequences of decoded bits, wherein each subsequence of decoded bits is associated with a probability; and reconstructing the significance maps in a context-based order by for each group of bits in the significance maps having a same context, determining a probability for each bit in that group, and forming each of the groups of bits from bits selected from the subsequences of decoded bits based on the determined probabilities.

In yet a further aspect, the present application describes a decoder for decoding encoded data for decoding a bitstream of encoded data to reconstruct a sequence of symbols. The decoder includes a processor; memory; and a decoding application stored in memory and containing instructions for configuring the processor to decode the bitstream in accordance with one of the methods described herein.

In yet a further aspect, the present application describes computer-readable media storing computer-executable program instructions which, when executed, configured a processor to perform the described methods of encoding and/or decoding.

Other aspects and features of the present application will be understood by those of ordinary skill in the art from a review of the following description of examples in conjunction with the accompanying figures.

The following description relates to data compression in general and, in particular, to the efficient encoding and decoding of finite alphabet sources, such as a binary source. In many of the examples given below, particular applications of such an encoding and decoding scheme are given. For example, many of the illustrations below make reference to video coding. It will be appreciated that the present application is not necessarily limited to video coding or image coding. It may be applicable to the any type of data subject to a context-based encoding scheme. In particular, it may be applicable to any context-based encoding scheme in which the context model provides that the context of symbols in a sequence X depends upon side information. Side information may include, for example, coefficient position in a matrix, a bit history for coefficients in that position, etc.

The example embodiments described herein relate to data compression of a finite alphabet source. Accordingly, the description often makes reference to "symbols", which are the elements of the alphabet. In some cases, the description herein refers to binary sources, and refers to the symbols as bits. At times, the terms "symbol" and "bit" may be used interchangeably for a given example. It will be appreciated that a binary source is but one example of a finite alphabet source. The present application is not limited to binary sources.

In the description that follows, example embodiments are described with reference to the H.264 standard. Those ordinarily skilled in the art will understand that the present application is not limited to H.264 but may be applicable to other video coding/decoding standards, including possible future standards, such as HEVC. It will also be appreciated that the present application is not necessarily limited to video coding/decoding and may be applicable to coding/decoding of any finite alphabet sources.

In the description that follows, in the context of video applications the terms frame and slice and picture are used somewhat interchangeably. Those of skill in the art will appreciate that, in the case of the H.264 standard, a frame may contain one or more slices. It will also be understood that under other video coding standards, such as HEVC, different terms such as picture may be used instead of frame or slice. It will further be appreciated that certain encoding/decoding operations are performed on a frame-by-frame basis, on a slice-by-slice basis, or on a picture-by-picture basis depending on the particular requirements of the applicable video coding standard. In any particular embodiment, the applicable video coding standard may determine whether the operations described below are performed in connection with frames, pictures and/or slices, as the case may be. Accordingly, those ordinarily skilled in the art will understand, in light of the present disclosure, whether particular operations or processes described herein and particular references to frames, slices, or both are applicable to frames, slices, pictures or any of them for a given embodiment.

In many of the examples herein, the processing may be based upon a coding unit, transform block, tile, macroblock, or other grouping or subgrouping of symbols or sequences appropriate for a given implementation.

Figure 2:
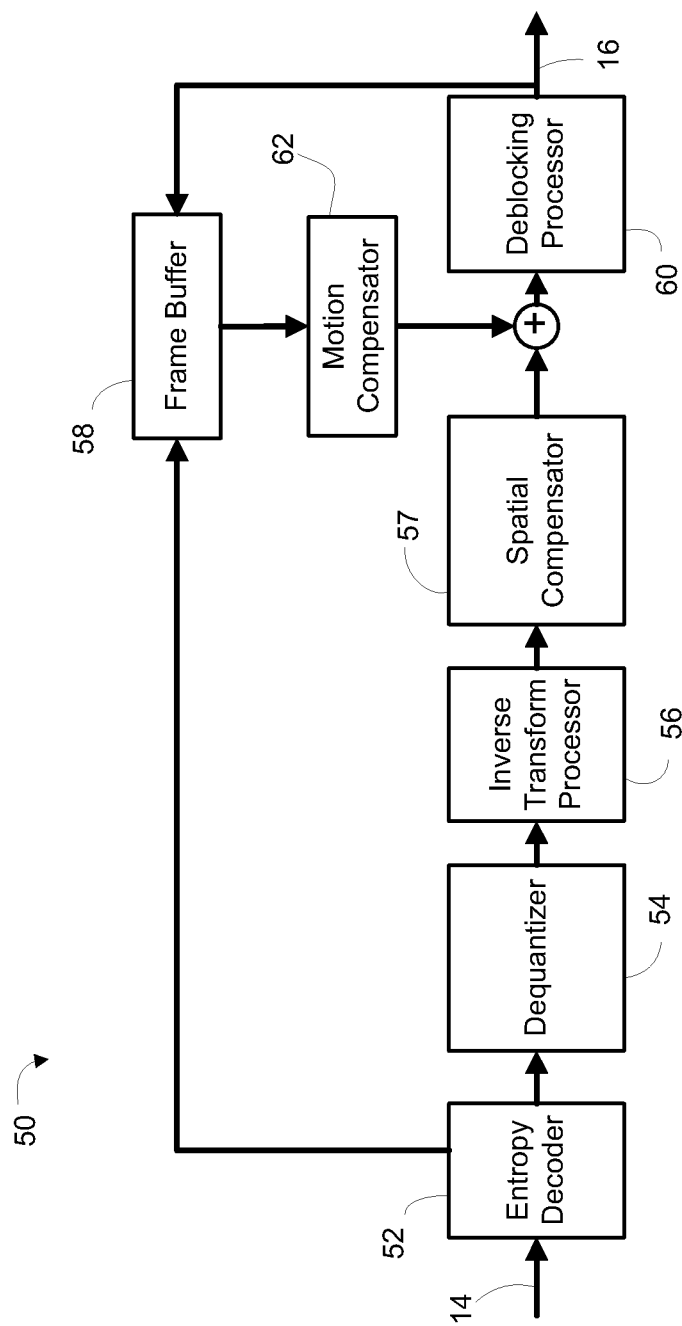
FIG. 2 shows, in block diagram form, a decoder for decoding video.

Reference is now made to FIG. 1, which shows, in block diagram form, an encoder 10 for encoding video. Reference is also made to FIG. 2, which shows a block diagram of a decoder 50 for decoding video. It will be appreciated that the encoder 10 and decoder 50 described herein may each be implemented on an application-specific or general purpose computing device, containing one or more processing elements and memory. The operations performed by the encoder 10 or decoder 50, as the case may be, may be implemented by way of application-specific integrated circuit, for example, or by way of stored program instructions executable by a general purpose processor. The device may include additional software, including, for example, an operating system for controlling basic device functions. The range of devices and platforms within which the encoder 10 or decoder 50 may be implemented will be appreciated by those ordinarily skilled in the art having regard to the following description.

The encoder 10 receives a video source 12 and produces an encoded bitstream 14. The decoder 50 receives the encoded bitstream 14 and outputs a decoded video frame 16. The encoder 10 and decoder 50 may be configured to operate in conformance with a number of video compression standards. For example, the encoder 10 and decoder 50 may be H.264/AVC of HEVC compliant. In other embodiments, the encoder 10 and decoder 50 may conform to other video compression standards, including evolutions of the H.264/AVC standard like HEVC.

The encoder 10 includes a spatial predictor 21, a coding mode selector 20, transform processor 22, quantizer 24, and entropy coder 26. As will be appreciated by those ordinarily skilled in the art, the coding mode selector 20 determines the appropriate coding mode for the video source, for example whether the subject picture/frame/slice is of I, P, or B type, and whether particular macroblocks or coding units within the frame, slice, picture or tile are inter- or intra-coded. The transform processor 22 performs a transform upon the spatial domain data. In particular, the transform processor 22 applies a block-based transform to convert spatial domain data to spectral components. For example, in many embodiments a discrete cosine transform (DCT) is used. Other transforms, such as a discrete sine transform or others may be used in some instances. Applying the block-based transform to a block of pixel data results in a set of transform domain coefficients. The set of transform domain coefficients is quantized by the quantizer 24. The quantized coefficients and associated information, such as motion vectors, quantization parameters, etc., are then encoded by the entropy coder 26.

Intra-coded frames/slices/pictures (i.e. type I) are encoded without reference to other frames/slices/pictures. In other words, they do not employ temporal prediction. However intra-coded frames/pictures do rely upon spatial prediction within the frame/picture, as illustrated in FIG. 1 by the spatial predictor 21. That is, when encoding a particular block/coding unit the data in the block/coding unit may be compared to the data of nearby pixels within blocks already encoded for that frame/slice/picture. Using a prediction algorithm, the source data of the block may be converted to residual data. The transform processor 22 then encodes the residual data. H.264, for example, prescribes nine spatial prediction modes for 4×4 transform blocks. In some embodiments, each of the nine modes may be used to independently process a block, and then rate-distortion optimization is used to select the best mode.

The H.264 standard also prescribes the use of motion prediction/compensation to take advantage of temporal prediction. Accordingly, the encoder 10 has a feedback loop that includes a de-quantizer 28, inverse transform processor 30, and deblocking processor 32. These elements minor the decoding process implemented by the decoder 50 to reproduce the frame/slice/picture. A frame store 34 is used to store the reproduced frames/pictures. In this manner, the motion prediction is based on what will be the reconstructed frames/pictures at the decoder 50 and not on the original frames/pictures, which may differ from the reconstructed frames/pictures due to the lossy compression involved in encoding/decoding. A motion predictor 36 uses the frames/slices/pictures stored in the frame store 34 as source frames/slices/pictures for comparison to a current frame/picture for the purpose of identifying similar blocks. Accordingly, for macroblocks or coding units to which motion prediction is applied, the "source data" which the transform processor 22 encodes is the residual data that comes out of the motion prediction process. The residual data is pixel data that represents the differences (if any) between the reference block or reference coding unit and the current block/unit. Information regarding the reference frame and/or motion vector may not be processed by the transform processor 22 and/or quantizer 24, but instead may be supplied to the entropy coder 26 for encoding as part of the bitstream along with the quantized coefficients.

Those ordinarily skilled in the art will appreciate the details and possible variations for implementing H.264 encoders.

The decoder 50 includes an entropy decoder 52, dequantizer 54, inverse transform processor 56, spatial compensator 57, and deblocking processor 60. A frame buffer 58 supplies reconstructed frames/pictures for use by a motion compensator 62 in applying motion compensation. The spatial compensator 57 represents the operation of recovering the video data for a particular intra-coded block from a previously decoded block.

The bitstream 14 is received and decoded by the entropy decoder 52 to recover the quantized coefficients. Side information may also be recovered during the entropy decoding process, some of which may be supplied to the motion compensation loop for use in motion compensation, if applicable. For example, the entropy decoder 52 may recover motion vectors and/or reference frame information for inter-coded macroblocks or coding units.

The quantized coefficients are then dequantized by the dequantizer 54 to produce the transform domain coefficients, which are then subjected to an inverse transform by the inverse transform processor 56 to recreate the "video data". It will be appreciated that, in some cases, such as with an intra-coded macroblock or coding unit, the recreated "video data" is the residual data for use in spatial compensation relative to a previously decoded block within the frame/picture. The spatial compensator 57 generates the video data from the residual data and pixel data from a previously decoded block. In other cases, such as inter-coded macroblocks or coding units, the recreated "video data" from the inverse transform processor 56 is the residual data for use in motion compensation relative to a reference block from a different frame/picture. Both spatial and motion compensation may be referred to herein as "prediction operations".

The motion compensator 62 locates a reference block within the frame buffer 58 specified for a particular inter-coded macroblock or coding unit. It does so based on the reference frame information and motion vector specified for the inter-coded macroblock or coding unit. It then supplies the reference block pixel data for combination with the residual data to arrive at the recreated video data for that macroblock or coding unit.

A deblocking process may then be applied to a reconstructed frame/slice/picture, as indicated by the deblocking processor 60. After deblocking, the frame/slice/picture is output as the decoded video frame/picture 16, for example for display on a display device. It will be understood that the video playback machine, such as a computer, set-top box, DVD or Blu-Ray player, and/or mobile handheld device, may buffer decoded frames in a memory prior to display on an output device.

Entropy coding is a fundamental part of all lossless and lossy compression schemes, including the video compression described above. The purpose of entropy coding is to represent a presumably decorrelated signal, often modeled by an independent, but not identically distributed process, as a sequence of bits. The technique used to achieve this must not depend on how the decorrelated signal was generated, but may rely upon relevant probability estimations for each upcoming symbol.

There are two common approaches for entropy coding used in practice: the first one is variable-length coding, which identifies input symbols or input sequences by codewords, and the second one is range (or arithmetic) coding, which encapsulates a sequence of subintervals of the [0, 1) interval, to arrive at a single interval, from which the original sequence can be reconstructed using the probability distributions that defined those intervals. Typically, range coding methods tend to offer better compression, while VLC methods have the potential to be faster. In either case, the symbols of the input sequence are from a finite alphabet.

A special case of entropy coding is when the input alphabet is restricted to binary symbols. Here VLC schemes must group input symbols together to have any potential for compression, but since the probability distribution can change after each bit, efficient code construction is difficult. Accordingly, range encoding is considered to have greater compression due to its greater flexibility, but practical applications are hindered by the higher computational requirements of arithmetic codes.

A common challenge for both of these encoding approaches is that they are serial in nature. In some important practical applications, such as high-quality video decoding, the entropy decoder has to reach very high output speed, which can pose a problem for devices with limited processing power or speed.

One of the techniques used together with some entropy coding schemes, such as CAVLC and CABAC, both of which are used in H.264/AVC, is context modeling. With context modeling, each bit of the input sequence has a context, where the context may be given by a certain subset of the other bits, such as the bits that preceded it, or side information, or both. In a first-order context model, the context may depend entirely upon the previous bit (symbol). In many cases, the context models may be adaptive, such that the probabilities associated with symbols for a given context may change as further bits of the sequence are processed. In yet other cases, the context of a given bit may depend upon its position in the sequence, e.g. the position or ordinal of a coefficient in a matrix or block of coefficients.

Figure 3:
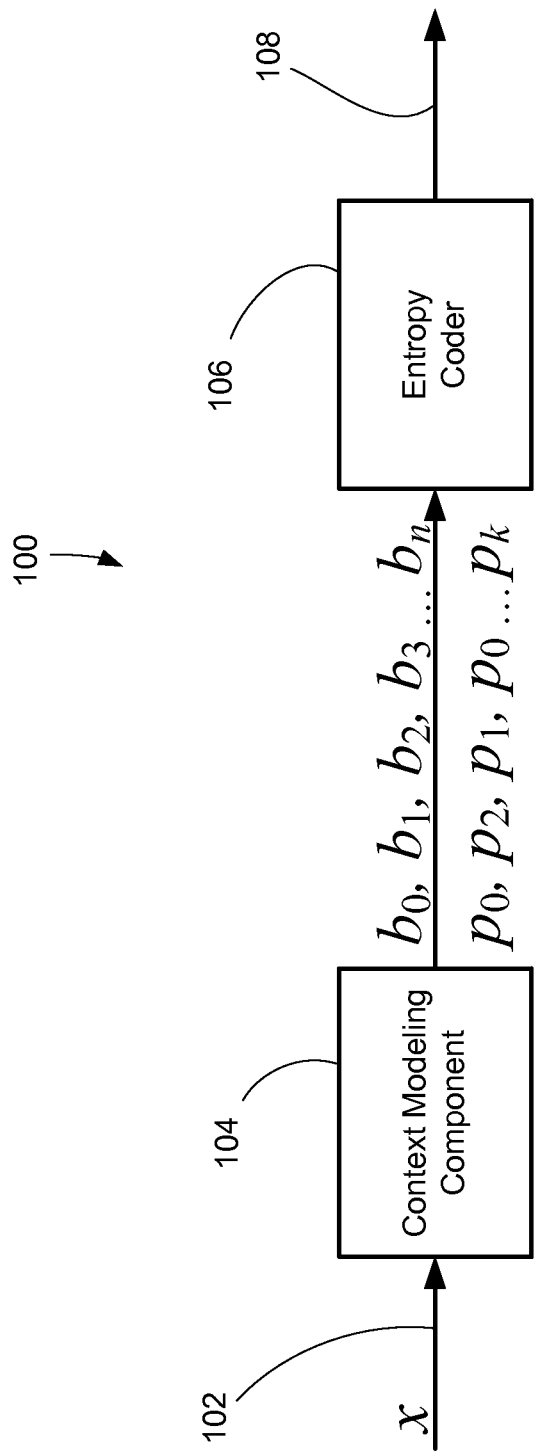
FIG. 3 shows a block diagram of an encoding process.

Reference is made to FIG. 3, which shows a block diagram of an example encoding process 100. The encoding process 100 includes a context modeling component 104 and an entropy coder 106. The context modeling component 104 receives the input sequence x 102, which in this example is a bit sequence ($b_0, b_1, \ldots, b_n$). In this example illustration, the context modeling component 104 determines a context for each bit $b_i$, perhaps based on one or more previous bits in the sequence or based on side information, and determines, based on the context, a probability $p_i$ associated with that bit $b_i$, where the probability is the probability that the bit will be the Least Probable Symbol (LPS). The LPS may be "0" or "1" in a binary embodiment, depending on the convention or application. The determination of the probability may itself depend upon the previous bits/symbols for that same context.

The context modeling component outputs the input sequence, i.e. the bits ($b_0, b_1, \ldots, b_n$) along with their respective probabilities ($p_0, p_1, \ldots, p_n$). The probabilities are an estimated probability determined by the context model. This data is then input to the entropy coder 106, which encodes the input sequence using the probability information. For example, the entropy coder 106 may be a binary arithmetic coder. The entropy coder 106 outputs a bitstream 108 of encoded data.

It will be appreciated each bit of the input sequence is processed serially to update the context model, and the serial bits and probability information are supplied to the entropy coder 106, which then serially entropy codes the bits to create the bitstream 108. Those ordinarily skilled in the art will appreciate that, in some embodiments, explicit probability information may not be passed from the context modeling component 104 to the entropy coder 106; rather, in some instances, for each bit the context modeling component 104 may send the entropy coder 106 an index or other indicator that reflects the probability estimation made by the context modeling component 104 based on the context model and the current context of the input sequence 102. The index or other indicator is indicative of the probability estimate associated with its corresponding bit.

In some embodiments, the entropy coder 106 may have a parallel processing architecture for encoding the input sequence 102. In such an embodiment, the entropy coder 106 may include a plurality of entropy coders each processing a portion of the input sequence 102. In some cases, the input sequence may be demultiplexed an allocated amongst the parallel entropy coders on the basis of the estimated probabilities associated with the respective bits. In other words, a bit from the input sequence 102 is allocated to one of the parallel entropy coders on the basis of its estimated probability.

At the decoder, the encoded bitstream is decoded using a reverse process. In particular, the decoder performs the same context modeling and probability estimation process to determine the context of the next reconstructed symbol of the reconstructed sequence. On the basis of the context determined for the next reconstructed symbol, an estimated probability is determined. The encoded bitstream, which may be made up of codewords output by the entropy coder(s), is decoded to obtain decoded symbols. The determination of context/probability is interleaved with the decoding of codewords to obtain decoded symbols corresponding to those estimate probabilities.

In a parallel encoding embodiment, the decoder may be configured to demultiplex the encoded bitstream into a plurality of decoded subseqeunces, each associated with an estimated probability. The context modeling and probability estimation then results in selection of a reconstructed symbol from the associated decode subsequence. It will be appreciated that in such an implementation the decoding of the encoded bitstream may be considered de-interleaved from the context modeling and probability estimation.

It will be appreciated from the detailed description below that the present application is applicable to either serial or parallel entropy coding and decoding.

A Context-Based Coding Order

The present application proposes a revised context-based coding order. In many situations, symbols of an input sequence are encoded in the order in which they appear in the input sequence. The present application proposes a context-based re-ordering of the symbols of the input sequence. Advantages in coding and decoding throughput may be available as a result.

The examples below may refer specifically to video encoding and, in particular, to the encoding of the sequences sig[i, j] and last[i, j], such as those defined in CABAC as specified in the ITU-T H.264/AVC standard. The examples illustrate the reordering of the coding/scanning order to facilitate decoding of more than one symbol at a time. It will be appreciated that the present application is not limited to the encoding and decoding of these two specific sequences within CABAC; nor is it limited to video encoding and decoding. The present application describes encoding and decoding methods and processes that may be applied to other data sequences, including video, image, and audio. The methods and processes herein are applicable to encoding and decoding processes that involve a context model which specifies context based upon information other than the other symbols in the sequence. The examples below may refer to a binary source as an example, although the present application is more generally applicable to any finite alphabet source.

In some cases the context model may specify the context of a bit based upon the bit's position in the sequence. For example, in a block-based coefficient encoding scheme such as that specified in ITU-T H.264/AVC, the sequences sig[i, j] and last[i, j] have a context based upon the position j of the coefficient in the sequence. In another example, the context of a bit may depend upon a bit value in a different sequence. It will be understood that the CABAC context model is only an example illustration and that the present application is not specific to position-based context models.

The H.264 context model for CABAC encodes DCT coefficients by first encoding a significance map. The significance map includes two sequences: sig[i, j] and last[i, j]. The first sequence sig[i, j] is a binary sequence indicating whether there is a non-zero coefficient in each position in the DCT block. The second sequence last[i, j] is a binary sequence mapped to the non-zero coefficients of the DCT block and indicating whether that non-zero coefficient is the last non-zero coefficient of the DCT block (in the zig-zag scanning order used in H.264).

Figure 6:
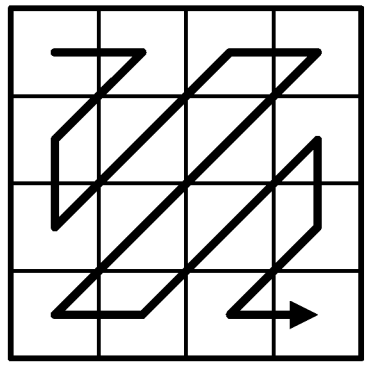
FIG. 6 illustrates a zig-zag coding order for a 4×4 block of coefficients.

The H.264 standard specifies a zig-zag scanning order, for encoding the coefficients of a DCT block. Referring to a 4×4 DCT block for example, the H.264 standard encodes the 16 coefficients in the zig-zag order illustrated in FIG. 6. As shown in FIG. 12, the scanning order begins in the upper left corner of the block and follows a zig-zag pattern to the lower right corner. Once arranged in this coding order, the resulting sequence of coefficients for the $i^{th}$ block is $X(i, 0), \ldots, X(i, 15)$.

A group of n blocks can be represented as a matrix of coefficients as follows:

| X[0, 0]   | X[0, 1] ...   | X[0, 15]   |
|-----------|---------------|------------|
| X[1, 0]   | X[1, 1] ...   | X[1, 15]   |
| ...       |               |            |
| X[n-1, 0] | X[n-1, 1] ... | X[n-1, 15] |

In this matrix X[i, j] denotes the $j^{th}$ coefficient of the $i^{th}$ block.

The H.264/AVC standard uses a scheme in which the blocks are encoded in sequence. In other words, each sequence $X(i, 0), \ldots, X(i, 15)$ is encoded for $i=0, 1, \ldots, n-1$, in turn. The context model used in H.264/AVC includes determining the two binary sequences, sig[i, j] and last[i, j] for each vector X[i, j]. The actual values of the coefficients are then also encoded.

To illustrate by example, consider the following example coefficient sequences X:
3, 5, 2, 0, 1, 1, 0, 1, 0, 0, 0, 0, 0, 0, 0, 0 i=0
6, 4, 0, 3, 3, 0, 1, 0, 0, 0, 0, 0, 0, 0, 0, 0 i=1
4, 2, 0, 0, 1, 0, 0, 0, 0, 0, 0, 0, 0, 0, 0, 0 i=2

The sequences sig[i, j] and last[i, j] for these coefficient sequences are as follows:
sig [0, j]=1, 1, 1, 0, 1, 1, 0, 1
last [i, j]=0, 0, 0, 0, 0, 1
sig [1, j]=1, 1, 0, 1, 1, 0, 1
last [1, j]=0, 0, 0, 0, 1
sig [2, j]=1, 1, 0, 0, 1
last [2, j]=0, 0, 1

It will be appreciated that, in this example, the last[i, j] sequence only includes values when the sig[i, j] is non-zero, and both sequences terminate after the last non-zero coefficient. Accordingly, last[i, j] will not necessarily include a bit for every bit j in sig[i, j]. It will be appreciated that the lengths of these sequences may vary depending on the coefficient values. Finally, it will be appreciated that until one knows whether the sig[i, j] sequence contains a non-zero bit, one does not know whether there is a corresponding bit in the last[i, j] sequence or not, meaning the encoding and decoding of these sequences is interleaved by bit position in this example embodiment.

The context model in H.264/AVC specifies context for the bits of these sequences on the basis of bit position. In other words, the context of bit j in the sequence sig[i, j] is j (+an offset, if any). Similarly, the context of bit j in the sequence last[i, j] is j (+an offset, if any). It will be understood that separate contexts are maintained for the two sequences, meaning that a sig[i, j] bit in the $j^{th}$ position does not have the same context as a last[i, j] bit in the $j^{th}$ position.

In the H.264/AVC example the probability (sometimes termed "state", "probability state" or "context state") for a bit is determined based on its context. Specifically, the bit history for that same context determines the probability (e.g. context state/probability state) that is selected or assigned to that bit. For example, for a bit in the $j^{th}$ position in a given sequence i, its probability state is selected from amongst the 64 possible probabilities based on the history of bits in the $j^{th}$ position in previous sequences (i−1, etc.).

As described above, the bits are encoded based upon their probabilities. In some example embodiments, parallel encoding may be used and, in some instances, the parallel encoding may include an entropy coder specific to each probability. In other example embodiments, serial entropy encoding may be used. In either case, the entropy coder encodes symbols based on their associated probabilities.

At the decoder, the same context modeling and probability estimation occurs in reconstructing the sequence. The probability estimation is used to decode the encoded bitstream to obtain reconstructed symbols. Symbols are selected from the decoded portions of the encoded bitstream and interleaved to form the reconstructed sequence of symbols on the basis of their associated probabilities and the context model.

It will be understood that a potential bottleneck occurs at the context modeling stage since context modeling and probability estimation is performed symbol-by-symbol. In the specific example of the significance map for H.264, the coding order described above means that decoding of sig[i, 0] . . . sig[1, 15] and last[i, 0] . . . last[i, 15] is interleaved. That is, the value of sig[i, j] impacts whether there is a bit for last[i, j] and the value of last[i, j] impacts whether there is a value for sig[i, j+1]. Therefore, the decoder is forced into assessing context and determining probability on a bit-by-bit serial basis.

If the decoder were to attempt to evaluate multiple bits at one time, large look-up tables would be required to account for all possible output strings. For example to decode 3 bits together starting at sig[i, j], the following information is needed:

The state for ctx_sig_offset+j (out of 64 possible values)
The state for ctx_last_offset+j+1 (needed if sig[i, j]==1)
The state for ctx_sig_offset+j+1
The state for ctx_last_offset+j+1 (needed if sig[i, j+1]==1)
The state for ctx_sig_offset+j+2 (needed if sig[i, j]==0 and sig[, j+1]==0).
wherein the context of the $j^{th}$ bit in sig is given by ctx_sig_offset+j, and the context of the $j^{th}$ bit in last is given by ctx_last_offset+j.

The above information results in $2^{21}$ possible combinations, which is almost infeasible to evaluate in practical applications.

Accordingly, the present application proposes a revised context-based coding order. In the specific context of video coding, the present application proposes a revised coding order different from the coding order specified in ITU-T H.264/AVC to facilitate more practical decoding of multiple bits at once.

In accordance with one aspect of the present application, the coding order may be revised so as to group values by context. In other words, for a group of blocks or for an input sequence, in which at least two symbols share a common context, the coding order specifies that those symbols sharing a common context be processed in sequence. This allows the decoder to decode values (e.g. determine probabilities/state and reconstruct the sequence of bits) for multiple bits from the same context at once, thereby reducing the number of combinations and permutations that need to be evaluated at once.

Using the specific example of video encoding outlined above, and the example matrix of sequences, X[0,j] to X[n−1, j], the coding order may be "vertical" (e.g., by bit position) instead of horizontal. For example, all bits in the j=0 position may be encoded, followed by all bits in the j=1 position, and so on, since all bits in the same bit position share a common context in this example. By grouping the coding of bits by context, the bottleneck due to interleaving is partially alleviated. In other words, in this example through coding by bit position, the interleaving is made more coarse, since the interleaving is from bit position to bit position, not vertically across sequences. This modification has the potential to improve throughput at the decoder by permitting the decoding of multiple bits at a time.

The following pseudocode illustrates a possible implementation of a revised coding order for encoding the significance map in a video encoding process:

```
For j=0, ..., 15
    For i=0, ..., n−1
        If (last[i, 0] + ... + last[i, j−1] == 0)
            Encode sig[i, j] with context_sig_offset + j;
        End
    End
    For i=0, ..., n−1
        If (sig[i, j] == 1)
            Encode last[i, j] with context_last_offset + j;
        End
    End
End
```

The sequences X(i, 0), . . . , X(i, 15) may still be formed using the zig-zag scanning order specified by in H.264/AVC, or any other scanning order specified by the applicable standard. However, a group of n sequences, i=0 to n−1, or blocks are encoded together at the context modeling stage by encoding the sequences by bit position j.

At the decoder, this permits the decoder to decode more than one bit at a time using practically-sized lookup tables (for example) where those 4 bits share a common context (i.e. bit position). Assuming the 64 states/probabilities used in H.264/AVC, a throughput of 4 bits per clock may be achievable since they would result in possible 1024 combinations. 6 bits would produce about 4 k combinations, 8 bits 16 k combinations, and so on. The lookup tables for evaluating the combinations may be encoded in hardware in some implementations.

In some video, image or audio encoding cases fewer probabilities/states may be used, which will ease the number of possible combinations and allows for more modestly-sized tables or even higher throughput.

To illustrate by way of an example, consider the example significance map detailed earlier:
sig [0, j]=1, 1, 1, 0, 1, 1, 0, 1
last [0, j]=0, 0, 0, . . . , 0, 0, . . . , 1
sig [1, j]=1, 1, 0, 1, 1, 0, 1
last [1, j]=0, 0, . . . , 0, 0, . . . , 1
sig [2, j]=1, 1, 0, 0, 1
last [2, j]=0, 0, . . . , . . . , 1

The encoding in this example is done in the order sig[0,0], sig[1,0], sig[2,0], last[0,0], last[1,0], last[2,0], sig[1,0], sig[2,0], . . . , and so on.

At the decoder, the decoder would decode the sequences by common context. First, the decoder decodes the three bits sig[0,0], sig[1,0], and sig[2,0] as a three-bit sequence since they share a common context (j=0). From this operation, the decoder reconstructs the sequence 1, 1, 1. Thus, it knows there are non-zero values in each of these positions, which means that last[i, 0] will have a value in each of these positions. Accordingly, the decoder then decodes the three bits last[0,0], last[1,0], and last[2,0] together since they share a common context. From this the decoder reconstructs the sequence 0, 0, 0.

Once the decoder reaches j=2, it decodes sig[i, 2] as 1, 0, 0. From this operation, it know that only last[0, 2] will have a value (no values have been encoded for last[1,2] or last[2,2]), so it will next decode the bit for last[0,2].

At j=5, the decoder decodes last[i, 5] as 0, 0, 1. Thus, it knows that the sequence sig[2, j] and last[2, j] are terminated. Accordingly, the decoder next decodes the bits sig[0,6] and sig[1,6] since they share a common context.

It will be appreciated, that the number of bits that may be processed together at the decoder may dwindle as the sequences terminate; however, the revised coding order permits the joint evaluation of a number of bits. It will also be appreciated that the number of sequences need not be three as in this example but may include more or fewer sequences. The limitation on the number of sequences is the practicality of evaluating the probability or state of each of the bits jointly, which may depend on the number of possible probabilities/states in the given context model, and any practical limitations on memory or processor speed in terms of evaluating the number of possible combinations.

In the context of video decoding, particularly video decoding based upon the H.264/AVC context model, within a loop of i, it is possible to decode multiple bits together by following the finite state machine used in the H.264/AVC context model to estimate probabilities.

In one alternative possible implementation, some compression efficiency is sacrificed by using a single probability estimation for a group of bits. At the encoder and decoder, a single probability estimation (probability state) is made for a group of bits having the same context and that probability is used to encode that group of bits. For example, the group of 3 bits for sig[0, j], j=0, 1, 2, are assigned a probability estimate and are all encoded using that same probability estimate. This reduces compression efficiency to some degree, but allows the encoding and decoding to avoid the need for tables for evaluating the probability combinations for all permutations of a group of bits.

In yet another possible implementation, the presently described reordered coding order that groups bits by context may be combined with a reordered context modeling, such as that described in U.S. application Ser. No. 61/325,806 filed Apr. 19, 2010, the contents of which are incorporated herein by reference. For example, the context modeling for encoding the significance map may be done in parallel with the context modeling for encoding motion vector information since they are unrelated; within the context modeling of the significance map the present modified coding order may be used to permit the decoding of multiple bits at a time. The parallel context modeling may result in an output bitstream in which even and odd bits are used for the two parallel encodings, for example.

It will be understood that the last sequence and sig sequence need not be interleaved. In some embodiments, the last sequence may contain a bin/bit for each bit position up to the position of the last significant coefficient. This enables independent coding of the last sequence. A decoder may then decode the last sequence, thereby determining the location of the last significant coefficient, and then decode the corresponding sig sequence. The independence of the last sequence also makes it possible to encode and decode a block or series of last sequences followed by their corresponding block or series of sig sequences. Even in these situations, the present application may be applied so as to group bits/symbols by context for encoding and decoding. In another variation, the last sequence may be replaced by a binarized two-dimensional location of the last significant coefficient.

Figure 7:
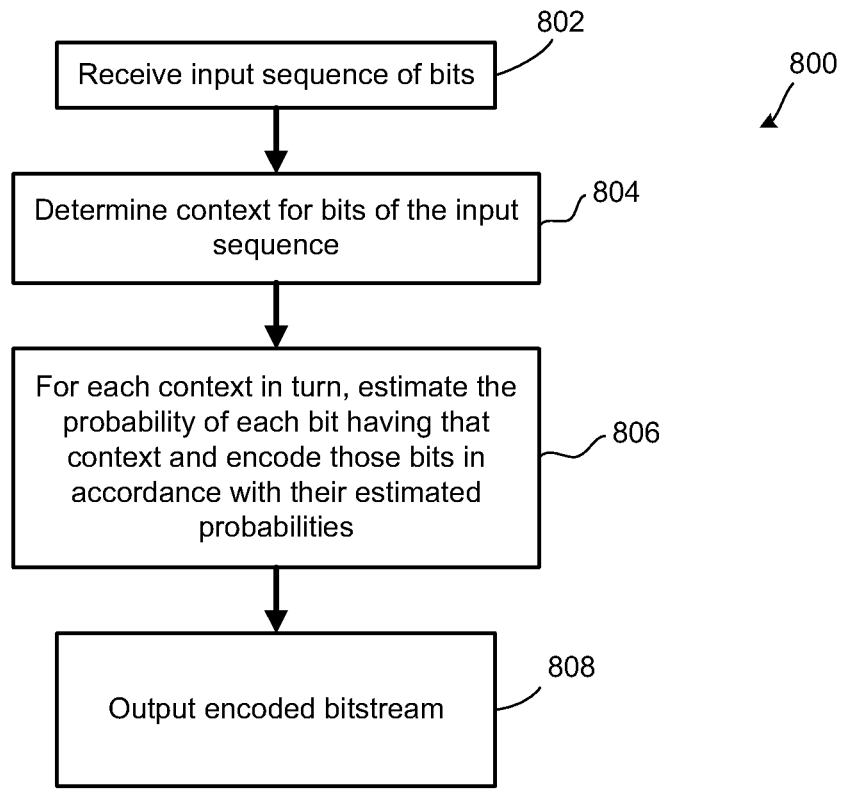
FIG. 7 shows, in flowchart form, an example method of entropy encoding an input sequence of bits.

Reference is now made to FIG. 7, which shows a simplified example method 800 of entropy encoding an input sequence of bits in accordance with an aspect of the present application. The method 800 includes receiving an input sequence of bits in operation 802. The input sequence of bits may be received through reading the input sequence from memory or from another computer-readable medium. The input sequence of bits may be received from another encoding process, such as, for example, a video, image or audio processing element, such as a spectral transform component for generating transform domain coefficients or quantized transform domain coefficients. Other sources of the input sequence of bits are also contemplated. The input sequence of bits may, in some embodiments, include a plurality of transform blocks or samples.

In operation 804, the method 800 includes determining a context for each of the bits of the input sequence. The context is prescribed by a context model, which specifies context for a bit based on information other than the other bits in the input sequence. In one example embodiment, the context may be based upon bit position within a block, set or sample of bits in the input sequence.

In operation 806, the bits may be grouped by their respective contexts. For each context, the method 800 includes determining the probability of each bit having that context and encoding those bits in accordance with their probabilities. The determination of probabilities is done on a context-by-context basis, meaning that the bits of the input sequence having the same context are processed consecutively. Estimating the probability of a given bit may include selecting from a set of predetermined candidate probabilities based upon the bit history for the context associated with that bit. Bits are encoded in accordance with their estimated probability by an entropy coder. In one example embodiment, more than one entropy coder is provided in parallel, and bits are allocated between the entropy coders on the basis of their estimated probabilities for encoding. In one example embodiment, an entropy coder is provided for each probability.

The encoded bitstream that results from the encoding of the bits is output in operation 808.

Figure 8:
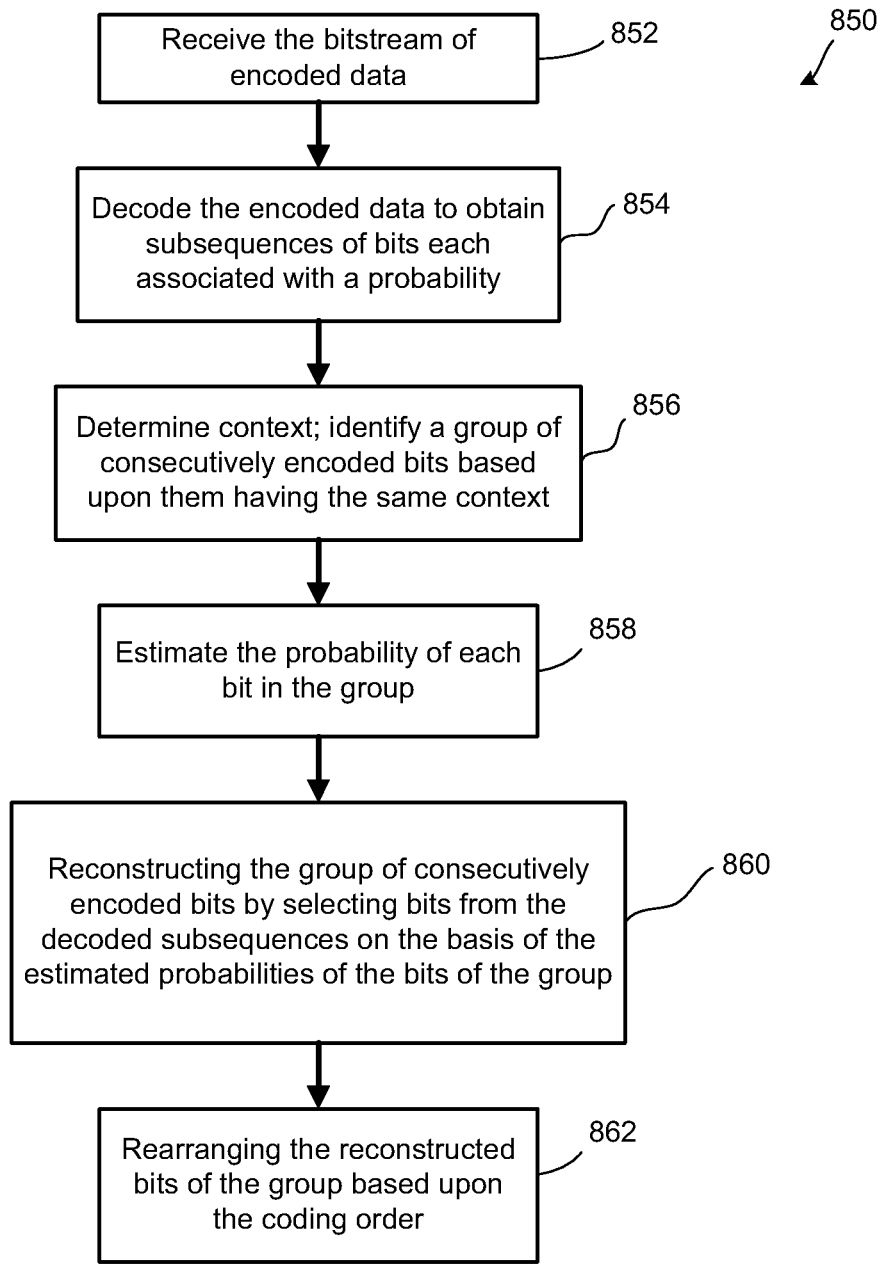
FIG. 8 shows, in flowchart form, an example method of entropy decoding a bitstream of encoded data.

Reference is now made to FIG. 8, which shows, in flowchart form, an example method 850 of decoding a bitstream of encoded data. The method 850 includes a first operation 852 of receiving the encoded data. Although the example herein refers to "bits", it will be appreciated that it is more generally applicable to "symbols" of a finite alphabet.

The received bitstream of encoded data is decoded in operation 854 to obtain decoded subsequences of bits each associated with a probability. In a serial implementation, it will be appreciated that operation 854 is interleaved with the determination of context and estimation of probability described below. In a parallel implementation operation 854 might be performed separately from the determination of context and estimation of probability to provide the decoded subsequences of bits.

The method 850 includes an operation 856 of determining the context of two or more bits to be reconstructed. In particular, operation 856 involves identifying a group of consecutively encoded bits based upon the group of bits having the same context. In other words, the context is determined and, based upon the coding order and bit history, if any, the decoder knows how many bits having the same context would have been consecutively encoded. For example, in the case of video encoding as illustrated above, when decoding j=0 the decoder may expect n bits are encoded for sig[i, j] since i will range from 0 to n−1. Later bit positions may have fewer bits with the same context, as may be determined by how many sequences have terminated and/or whether there are non-zero bits in the sig vector. The decoder may be configured to impose a maximum number of bits to assess in a group. When the number of bits having a given context exceeds the maximum that the decoder is configured to handle at one time, the decoder may process a given context in two or more groups.

In operation 858, the method includes estimating the probabilities of each bit in the group of consecutive bits having the same context. The estimation of the bit probabilities may include use of a look-up table, decision tree, state machine, or other mechanisms for efficient determination of probabilities of more than one bit at the same time.

In the serial case, the group of bits may then be decoded from the encoded data on the basis of their estimated probabilities. After decoding a series of groups of bits each corresponding to one of the contexts, the decoder reorders the bits as described below in connection with operation 862.

Returning to the parallel decoding example, operation 860 involves reconstructing the group of sequentially encoded bits by selecting bits from the decoded subsequences of bits based on the estimated probabilities determined in operation 858.

In operation 862 the reconstructed group of bits may be rearranged based upon the coding order.

It will be appreciated that operations 854, 856, 858 and 860 may be repeated in a cycle to obtain a plurality of groups of bits for a plurality of contexts and the rearrangement in operation 862 may include interleaving bits or allocating them so as to reconstruct the input sequence of bits in light of the context-based coding order used at the encoder.

Figure 9:
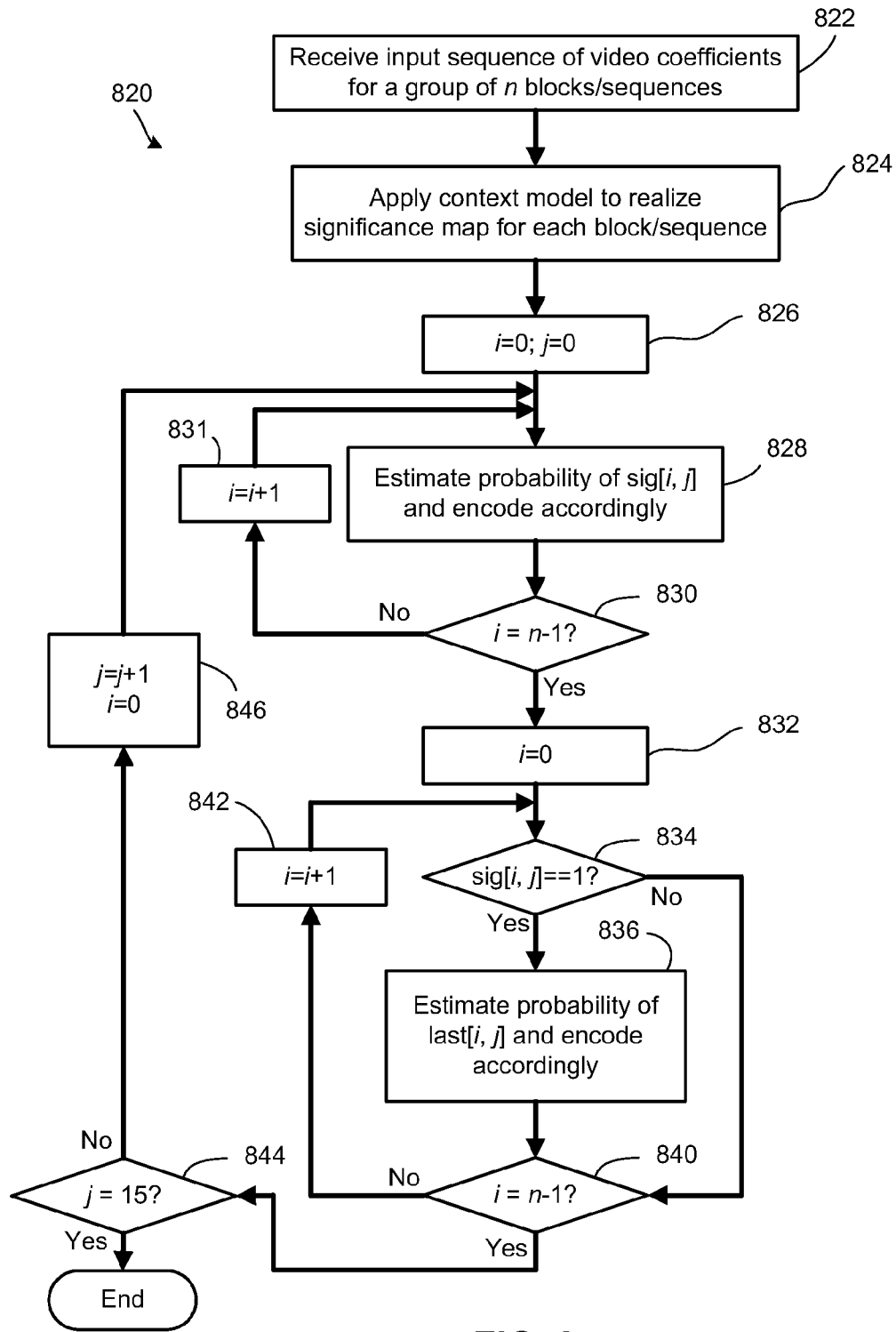
FIG. 9 shows, in flowchart form, an example method of entropy encoding significance maps for a group of blocks of quantized DCT coefficients in a video encoding process.

Reference will now be made to FIG. 9, which shows a more detailed flowchart illustrating an example method 820 of encoding quantized transform domain coefficients in a video encoding process. The input sequence of quantized transform domain coefficients is received in operation 822 of the method 820. The input sequence includes a set or group of n blocks or sequences of quantized transform domain coefficients.

In operation 824, the context model, such as, for example CABAC in H.264/AVC, is applied to generate a significance map for each of the n blocks or sequences. The significance map for each block includes the sequences sig[i, j] and last [i, j]. In operation 826, the indexes i and j are initialized to zero. Index i is an index of the sequence/block, wherein i ranges from 0 to n−1. Index j is an index of the bit position, wherein in this example j ranges from 0 to 15 on the basis that the present example applies to 4×4 transform blocks. Other sizes may be used in other applications.

In a loop of operations 828, 830 and 831, the probability of sig[i, j] is estimated and the bit is encoded accordingly, which may include allocating the bit to the entropy encoding associated with the probability estimate. The loop of operations 828, 830 and 831 cycles through each sig bit in all blocks/sequences for a given bit position, i.e. until i=n−1. Although not explicitly shown, for a given position j operation 828 is conditional on the sequence/block sig i not having already terminated.

The method 820 then includes a loop of operations 834, 836, 840, and 842. The loop estimates the probability of and encodes the last[i, j] bits for a bit position j. It will be noted that the last[i, j] bit is only encoded if the corresponding sig[i, j] bit is equal to 1.

After operation 840 reaches the last of the sequences/blocks, i.e. i=n−1, the method 820 evaluates whether it has reached the last bit position, i.e. whether j=15, and if not then the method 820 increments bit position index j in operation 846, resets block index i, and returns to operation 828. The method 820 results in the encoding of the sig[i, j] and last[i, j] sequences, i.e. the significance maps, for the groups of n blocks/sequences in an encoding order based on grouping bits together sequentially for encoding that share the same context, wherein encoding means determining the probability of each bit and entropy encoding it accordingly.

In a variation to method 820, the group of last[i, j] bits for bit position j may be encoded for i=0 to n, for j=0 until the sequences terminate. The sig sequences are then encoded (except the last bit, which is known to be a 1 and is at a known location based on the last sequences) using the context-based coding order.

Figure 10:
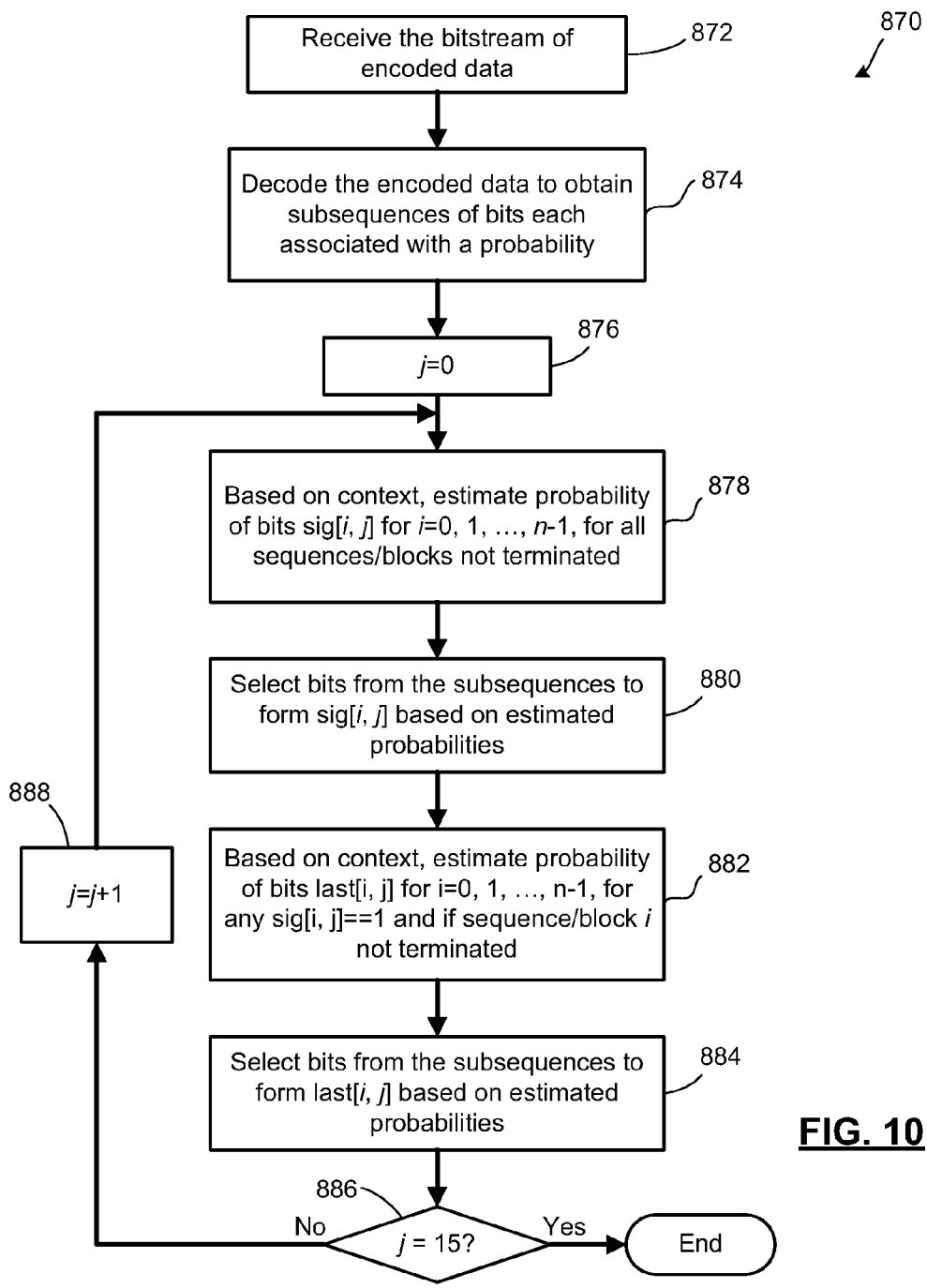
FIG. 10 shows, in flowchart form, an example method of entropy decoding a bitstream of encoded video data to reconstruct significance maps for a group of blocks of quantized DCT coefficients in a video decoding process.

Reference is now made to FIG. 10, which shows, in flowchart form, a method 870 for decoding a bitstream of encoded video data. The encoded video data includes codewords generated by one or more entropy encoders. Each codeword may be decoded to obtain a decoded subsequence of bits associated with an estimated probability. In this example, the probabilities are selected from a predetermined set of candidate probabilities such as, for example, the 64 probabilities or states defined in CABAC for H.264/AVC.

The method 870 includes receiving the bitstream of encoded video data in operation 872. The encoded video data may be received by way of a broadcast transmission or download over a network, or by reading the bitstream of encoded video data from a computer-readable medium, such as a compact disc or other optical or magnetic storage medium. The encoded video data is decoded in operation 874 by decoding the codewords to generate the subsequences of bits each associated with a probability. It will be appreciated that operation 874 may be interleaved with the operations described below such that the decoding occurs as probability estimations are made and further decoded bits associated with that probability are required for the reconstruction.

In operation 876 the indexes i and j are initialized to zero. The indexes have the same meaning explained above in connection with FIG. 15.

In operation 878, for a given bit position j, i.e. for a common context, the probability is estimated for each bit sig[i, j] in the blocks/sequences i=0 to n−1. For a given block or sequence i, this is conditional on the sequence/block not having already terminated, which can be determined by whether a last[i, <j] bit equal to 1 has been identified for earlier bit positions such as j−1, j−2, etc. A look-up table, decision tree, or other data structure or mechanism may be used to nearly simultaneously estimate the probabilities of two or more bits at a time.

It will be appreciated that in some embodiments, the decoder may not be configured to evaluate at the same time all n bits that may have the same context. In this case, the decoder may evaluate the n bits in two or more groups of multiple bits.

In operation 880, having estimated the probabilities of the bits sig[i, j] across multiple sequences i for a given j, bits are selected from the decode subsequences of bits on the basis of those estimated probabilities to form or reconstruct those bits of sig[i, j].

Similar operations 882 and 884 are then performed to reconstruct bits of last[i, j] for a given bit position across a group of sequences/blocks i.

These operations 878, 880, 882, 884 are repeated as j is incremented in operation 888 until j reaches its limit as indicated by operation 886. It will be appreciate that this loop may be ended earlier if all sig sequences have terminated at earlier bit positions. The vectors sig[i, j] and last[i, j] that form the significance maps for the group of sequences/blocks are thus reconstructed.

In a variation of method 870, the decoder first decodes all n of the last sequences, which are in the bitstream in a context-based order as described above. The decoder then decodes all n of the sig sequences in the context-based order.

It will be appreciated that the foregoing example methods are illustrations of a specific example application for encoding and decoding significance maps, such as those prescribed in H.264. The present application is not limited to that specific example application.

Figure 4:
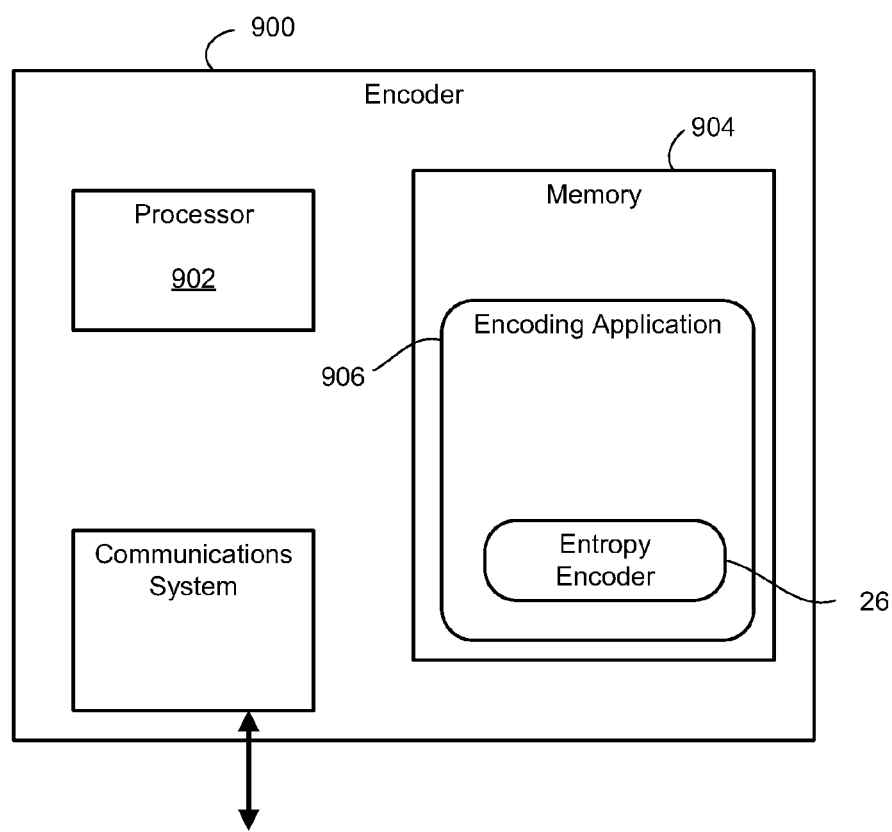
FIG. 4 shows a simplified block diagram of an example embodiment of an encoder.

Reference now made to FIG. 4, which shows a simplified block diagram of an example embodiment of an encoder 900. The encoder 900 includes a processor 902, memory 904, and an encoding application 906. The encoding application 906 may include a computer program or application stored in memory 904 and containing instructions for configuring the processor 902 to perform steps or operations such as those described herein. For example, the encoding application 906 may encode and output bitstreams encoded in accordance with the modified context-based coding order process described herein. The encoding application 906 may include an entropy encoder 26 configured to entropy encode input sequences and output a bitstream using one or more of the processes described herein. It will be understood that the encoding application 906 may be stored in on a computer readable medium, such as a compact disc, flash memory device, random access memory, hard drive, etc.

In some embodiments, the processor 902 in the encoder 900 may be a single processing unit configured to implement the instructions of the encoding application 906. It will further be appreciated that in some instances, some or all operations of the encoding application 906 and one or more processing units may be implemented by way of application-specific integrated circuit (ASIC), etc.

Figure 5:
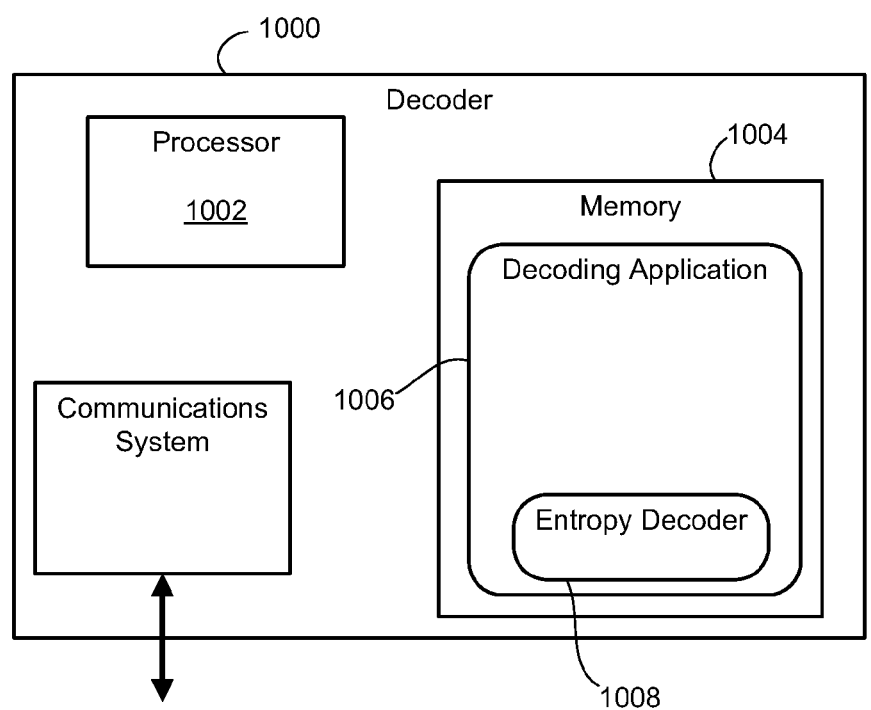
FIG. 5 shows a simplified block diagram of an example embodiment of a decoder.

Reference is now also made to FIG. 5, which shows a simplified block diagram of an example embodiment of a decoder 1000. The decoder 1000 includes a processor 1002, a memory 1004, and a decoding application 1006. The decoding application 1006 may include a computer program or application stored in memory 1004 and containing instructions for configuring the processor 1002 to perform steps or operations such as those described herein. The decoding application 1006 may include an entropy decoder 1008 configured to receive a bitstream encoded in accordance with the modified context-based coding order process described herein, and to extract encoded subsequences from the bitstream and perform multi-bit probability estimation for decoding of groups of bits having the same context, as described herein. It will be understood that the decoding application 1006 may be stored in on a computer readable medium, such as a compact disc, flash memory device, random access memory, hard drive, etc.

In some embodiments, the processor 1002 in the decoder 1000 may be a single processing unit configured to implement the instructions of the decoding application 1006. In some other embodiments, the processor 1002 may include more than one processing unit capable of executing instructions in parallel. The multiple processing units may be logically or physically separate processing units. It will further be appreciated that in some instances, some or all operations of the decoding application 1006 and one or more processing units may be implemented by way of application-specific integrated circuit (ASIC), etc.

It will be appreciated that the decoder and/or encoder according to the present application may be implemented in a number of computing devices, including, without limitation, servers, suitably programmed general purpose computers, set-top television boxes, television broadcast equipment, and mobile devices. The decoder or encoder may be implemented by way of software containing instructions for configuring a processor to carry out the functions described herein. The software instructions may be stored on any suitable computer-readable memory, including CDs, RAM, ROM, Flash memory, etc.

It will be understood that the encoder and decoder described herein and the module, routine, process, thread, or other software component implementing the described method/process for configuring the encoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method for decoding encoded data to reconstruct a sequence of symbols, wherein the encoded data has been encoded in accordance with a context model, wherein the context model specifies a context for each symbol, the method comprising:
for each of two or more of the contexts, decoding a portion of the encoded data to obtain a group of consecutive symbols having that context, wherein decoding includes
jointly determining in parallel, for the consecutive symbols in one of the groups, a probability associated with each symbol, and
decoding each of the consecutive symbols from the encoded data based on its determined probability; and
reconstructing the sequence of symbols by reordering the symbols of the groups of consecutive symbols, wherein reordering the symbols results in a series of sequences, and wherein the context for each symbol is associated, at least in part, with that symbol's position in its sequence.

2. The method claimed in claim 1, wherein the reordering is based upon a coding order specified by the context model.

3. The method claimed in claim 2, wherein each of the groups of consecutive symbols is associated with one of the contexts defined in the context model, and wherein the reordering includes interleaving the symbols of the groups to undo the context-based grouping.

4. The method claimed in claim 1, wherein the group of consecutive symbols contains symbols having the same symbol position in their respective sequences.

5. The method claimed in claim 1, wherein the encoded data comprises a plurality of significance maps, each map including a significant-coefficient sequence and a last-coefficient sequence, and wherein each group of consecutive symbols comprises bits having the same bit position in a series of the significant-coefficient sequences or the last-coefficient sequences.

6. A decoder for decoding encoded data to reconstruct a sequence of symbols, wherein the encoded data has been encoded in accordance with a context model, wherein the context model specifies a context for each symbol, the decoder comprising:
a processor;
a memory; and
a decoding application stored in memory and containing instructions for configuring the processor to decode the encoded data by
for each of two or more of the contexts, decoding a portion of the encoded data to obtain a group of consecutive symbols having that context, wherein decoding includes
jointly determining in parallel, for the consecutive symbols in one of the groups, a probability associated with each symbol, and
decoding each of the consecutive symbols from the encoded data based on its determined probability, and
reconstructing the sequence of symbols by reordering the symbols of the groups of consecutive symbols, wherein reordering the symbols results in a series of sequences, and wherein the context for each symbol is associated, at least in part, with that symbol's position in its sequence.

7. The decoder claimed in claim 6, wherein the processor is configured to reorder the symbols based upon a coding order specified by the context model.

8. The decoder claimed in claim 7, wherein each of the groups of consecutive symbols is associated with one of the contexts defined in the context model, and wherein the processor is configured to reorder by interleaving the symbols of the groups to undo the context-based grouping.

9. The decoder claimed in claim 6, wherein the group of consecutive symbols contains symbols having the same symbol position in their respective sequences.

10. The decoder claimed in claim 6, wherein the encoded data comprises a plurality of significance maps, each map including a significant-coefficient sequence and a last-coefficient sequence, and wherein each group of consecutive symbols comprises bits having the same bit position in a series of the significant-coefficient sequences or the last-coefficient sequences.

11. A method of entropy encoding an input sequence of symbols using a context model, wherein the context model specifies a context for each symbol, the method comprising:
reordering the input sequence to group the symbols on the basis of context to form groups of symbols, each group being associated with a respective one of the contexts;
for each of the groups of symbols, jointly determining in parallel, for the symbols in the group, a probability associated with each symbol; and
for each of the groups of symbols, encoding consecutively the symbols in that group based upon their determined probabilities, to produce encoded data, wherein the input sequence includes a series of sequences and wherein the context for each symbol is based, at least in part, upon that symbol's position in its sequence.

12. The method claimed in claim 11, wherein the group of consecutive symbols contains symbols having the same symbol position in their respective sequences.

13. The method claimed in claim 11, wherein the input sequence comprises a plurality of significance maps, each map including a significant-coefficient sequence and a last-coefficient sequence, and wherein each group of symbols comprises bits having the same bit position in a series of the significant-coefficient sequences or the last-coefficient sequences.

14. An encoder for entropy encoding an input sequence of symbols using a context model, wherein the context model specifies a context for each symbol, the encoder comprising:
a processor;
a memory; and
an encoding application stored in memory and containing instructions for configuring the processor to encode the input sequence by:
reordering the input sequence to group the symbols on the basis of context to form groups of symbols, each group being associated with a respective one of the contexts,
for each of the groups of symbols, jointly determining in parallel, for the symbols in the group, a probability associated with each symbol, and
for each of the groups of symbols, encoding consecutively the symbols in that group based upon their determined probabilities, to produce encoded data, wherein the input sequence includes a series of sequences and wherein the context for each symbol is based, at least in part, upon that symbol's position in its sequence.

15. The encoder claimed in claim 14, wherein the group of consecutive symbols contains symbols having the same symbol position in their respective sequences.

16. The encoder claimed in claim 14, wherein the input sequence comprises a plurality of significance maps, each map including a significant-coefficient sequence and a last-coefficient sequence, and wherein each group of symbols comprises bits having the same bit position in a series of the significant-coefficient sequences or the last-coefficient sequences.

* * * * *